United States Patent [19]

Nishiura et al.

[11] Patent Number: 5,736,769
[45] Date of Patent: Apr. 7, 1998

[54] SEMICONDUCTOR APPARATUS

[75] Inventors: Akira Nishiura; Tatsuhiko Fujihira, both of Nagano, Japan

[73] Assignee: Fuji Electric Co., Ltd., Tokyo, Japan

[21] Appl. No.: 652,115

[22] Filed: May 23, 1996

[30] Foreign Application Priority Data

May 23, 1995 [JP] Japan ................... 7-123311

[51] Int. Cl.$^6$ ................... H01L 29/76
[52] U.S. Cl. ................... 257/368; 257/140; 257/470
[58] Field of Search ................... 257/139, 140, 257/147, 337, 368, 470

[56] References Cited

U.S. PATENT DOCUMENTS 4,992,844  2/1991  Yakushiji ................... 257/140

*Primary Examiner*—Mark V. Prenty
*Attorney, Agent, or Firm*—Morrison Law Firm

[57] ABSTRACT

A semiconductor apparatus includes an insulated gate semiconductor device used as a power device and a pn diode used as a temperature sensor on a single semiconductor substrate. Heat generated in the power device is conducted to the temperature sensor. The voltage across a forward biased pn diode fed by a constant current source is sensitive to temperature. The temperature of the power device is measured by feeding a small current from a constant current supply to the pn diode and by detecting the forward voltage of the pn diode. When the forward voltage reaches a predetermined value, an external protection circuit is activated to prevent overheating. Multiple pn diodes may be connected in series to detect the temperature of multiple power devices more accurately.

17 Claims, 10 Drawing Sheets

SEMICONDUCTOR APPARATUS

BACKGROUND OF THE INVENTION

The present invention relates to an insulated gate semiconductor apparatus having a temperature sensing function.

Many types of intelligent power modules (hereinafter referred to as "IPMs"), which employ an insulated gate semiconductor device such as an insulated gate bipolar transistor (hereinafter referred to as an "IGBT") or a MOSFET as a power device, are well known in the art. These IPMs incorporate various sensing elements including a temperature sensor Incorporated in a single package with the insulated gate semiconductor device. Usually, a thermistor is used as the temperature sensor of the IPMs. The thermistor is bonded to a metal base. A chip of the insulated gate semiconductor device is also bonded to the metal base. The chip detects the temperature of the insulated gate semiconductor device.

Recently, the capacity of the IPMs has been increasing. Usually, six insulated gate semiconductor devices are mounted within a package. If one thermistor is used for sensing temperatures of the six semiconductor devices, it is impossible to detect the actual temperature of the semiconductor devices positioned away from the thermistor accurately and quickly. Thus, one thermistor is insufficient to prevent multiple semiconductor devices from overheating. If multiple thermistors are used for quickly detecting the temperatures of the respective insulated gate semiconductor devices, the cost of the IPM soars.

OBJECTS AND SUMMARY OF THE INVENTION

Accordingly, an object of the present invention is to provide a semiconductor apparatus which overcomes the drawbacks and limitations of the prior art.

Another object of the present invention to provide a semiconductor apparatus having an insulated gate semiconductor device and a temperature sensor mounted on a single semiconductor substrate to quickly and accurately protect the semiconductor device from overheating.

Briefly stated, a semiconductor apparatus includes an insulated gate semiconductor device used as a power device and a pn diode used as a temperature sensor on a single semiconductor substrate. Heat generated in the power device is conducted to the temperature sensor. The voltage across a forward biased pn diode fed by a constant current source is sensitive to temperature. The temperature of the power device is measured by feeding a small current from a constant current supply to the pn diode and by detecting the forward voltage of the pn diode. When the forward voltage reaches a predetermined value, an external protection circuit is activated to prevent overheating. Multiple pn diodes may be connected in series to detect the temperature of multiple power devices more accurately.

According to an embodiment of the invention, there is provided a semiconductor apparatus, including a semiconductor substrate of a first conductivity type, a well region of a second conductivity type in a first surface portion of the semiconductor substrate, an emitter region of the first conductivity type in the well region, the well region and the emitter region forming an insulated gate semiconductor device, an emitter electrode on the emitter region, an anode region of the second conductivity type in a second surface portion of the semiconductor substrate, the anode region being separated laterally from the well region, an anode electrode on the anode region, a cathode region of the first conductivity type in the anode region, a cathode electrode on the cathode region, the cathode electrode being connected to the emitter electrode, and the anode region and the cathode region forming a pn diode.

According to an embodiment of the invention, there is provided a semiconductor apparatus, including a semiconductor substrate of a first conductivity type, a well region of a second conductivity type in a first surface portion of the semiconductor substrate, an emitter region of the first conductivity type in the well region, the well region and the emitter region forming an insulated gate semiconductor device, an emitter electrode on the emitter region, anode regions of the second conductivity type, an anode electrode on each of the anode regions, cathode regions of the first conductivity type formed in the anode regions, a cathode electrode on each of the cathode regions, the anode regions and the cathode regions forming at least two pn diodes in a second surface portion of the semiconductor substrate, the at least two pn diodes being separated laterally from the insulated gate semiconductor device, and metal films formed on the semiconductor substrate with an insulation film interposed in-between, each of the metal films connecting the anode electrode of one of the at least two pn diodes to the cathode electrode of an adjacent one of the at least two pn diodes, whereby the at least two pn diodes are connected in a series connection.

According to an embodiment of the invention, there is provided a semiconductor apparatus, including an insulated gate semiconductor device on a semiconductor substrate, at least one pn diode on the semiconductor substrate in thermal communication with the insulated gate semiconductor device, a constant current supply, and means for feeding a current of the constant current supply to the at least one pn diode, whereby a voltage across the at least one pn diode is sensitive to a temperature of the insulated gate semiconductor device and monitoring the voltage provides an indication of a temperature of the insulated gate semiconductor device.

According to an embodiment of the invention, there is provided a semiconductor apparatus, including at least first and second insulated gate semiconductor devices on a semiconductor substrate, a first pn diode in thermal communication with the first insulated gate semiconductor device, a second pn diode in thermal communication with the second insulated gate semiconductor device, and the first and second pn diodes being connected in series, whereby a voltage of the series connected first and second pn diodes is sensitive to the temperature of both first and second insulated gate semiconductor devices.

According to an embodiment of the invention, there is provided a method of making a semiconductor apparatus, including forming an insulated gate semiconductor device on a semiconductor substrate, forming at least one pn diode on the semiconductor substrate in thermal communication with the insulated gate semiconductor device, and feeding a current of a constant current supply to the at least one pn diode, whereby a voltage across the at least one pn diode is sensitive to a temperature of the insulated gate semiconductor device and monitoring the voltage provides an indication of a temperature of the insulated gate semiconductor device.

According to an embodiment of the invention, there is provided a semiconductor apparatus, including a MOSFET device on a semiconductor substrate, at least one pn diode on the semiconductor substrate in thermal communication with the MOSFET device, a constant current supply, and means for feeding a current of the constant current supply to the at least one pn diode, whereby a voltage across the at least one pn diode is sensitive to a temperature of the MOSFET device and monitoring the voltage provides an indication of a temperature of the MOSFET device.

According to an aspect of the present invention, there is provided a semiconductor apparatus which includes a semiconductor substrate of a first conductivity type, an insulated gate semiconductor device including a well region of a second conductivity type in a first surface portion of the semiconductor substrate, an emitter region of the first conductivity type in the well region, and an emitter electrode on the emitter region, and a pn diode including an anode region of the second conductivity type selectively formed in a second surface portion of the semiconductor substrate, the anode region being separated apart laterally from the well region, an anode electrode on the anode region, a cathode region of the first conductivity type selectively formed in the anode region, a cathode electrode on the cathode region, the cathode electrode being connected to the emitter electrode.

According to another aspect of the present invention, there is provided a semiconductor apparatus which includes a semiconductor substrate of a first conductivity type, an insulated gate semiconductor device including a well region of a second conductivity type in a first surface portion of the semiconductor substrate, an emitter region of the first conductivity type in the well region, and an emitter electrode on the emitter region, two or more pn diodes in a second surface portion of the semiconductor substrate, the pn diodes being separated apart laterally from the insulated semiconductor device, each of the two or more pn diodes including an anode region of the second conductivity type, an anode electrode on the anode region, a cathode region of the first conductivity type selectively formed in the anode region, and a cathode electrode on the cathode region, and metal films selectively formed on the semiconductor substrate with an insulation film interposed in-between, each of the metal film connecting the anode electrode of one of the two or more pn diodes to the cathode electrode of an adjacent one of the two or more pn diodes to connect the two or more pn diodes in series.

According to a feature of the present invention, the well region and anode region have the same dopant concentration and the same depth, and the emitter region and the cathode region have the same dopant concentration and the same depth. It is preferable to form each cathode region concentrically with the pairing anode region.

According to a feature of the present invention, the semiconductor apparatus is provided with a region of the second conductivity type surrounding the anode region or the anode regions, the region of the second conductivity type being spaced apart laterally from the insulated gate semiconductor device, and a metal electrode on the region of the second conductivity type connected to the emitter electrode and the cathode electrode or the cathode electrode located at an end of the series connection of the pn diodes.

According to a still further feature of the present invention, the semiconductor apparatus is further provided with an anode terminal connected to the anode electrode or the anode electrode located at an end of the series connection of the pn diodes, an emitter terminal connected to the emitter electrode, a constant current supply including a positive electrode connected to the anode terminal, and a negative electrode connected to the emitter terminal to make a current flow from the anode region to the cathode region of each pn diode, and a temperature sensing terminal for sensing the lateral insulated gate semiconductor device's temperature from the voltage drop across the pn diode or the pn diodes connected in series, the temperature sensing terminal being connected to the anode electrode or the anode electrode at the end of the series connection of the pn diodes.

According to a still further feature of the present invention, the present semiconductor apparatus includes a lightly doped n-type semiconductor substrate, a p-type well region in a first surface portion of the substrate, an n-type emitter region in the p-type well region, a gate electrode above the p-type well region, an emitter electrode on the n-type emitter region and a contact region of p-type well region, a $p^+$ or $n^+$ collector region on a back surface of the substrate, a collector electrode on the collector region, an anode region in a second surface portion of the substrate, a cathode region in the anode region, an anode electrode on the anode region, and a cathode electrode on the cathode region. The anode region and the cathode region constitute a temperature sensor. The anode electrode is connected to a temperature detecting terminal. The cathode electrode is connected to the emitter electrode.

By integrating an insulated gate semiconductor device as a power device and a temperature sensor on a single semiconductor substrate, the heat generated in the power device is conducted to the temperature sensor in a short time with less dissipation. A pn diode is formed as the temperature sensor on the semiconductor substrate. The forward voltage of the pn diode (voltage drop across the pn diode) drops with increasing temperature. Therefore, the temperature of the power device is measured by feeding a small current from a constant current supply to the pn diode and by detecting the forward voltage of the pn diode. By connecting multiple pn diodes in series, a total forward voltage (voltage drop across the pn diodes) and therefore a total voltage change with temperature are multiplied to facilitate detecting the temperature more accurately.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
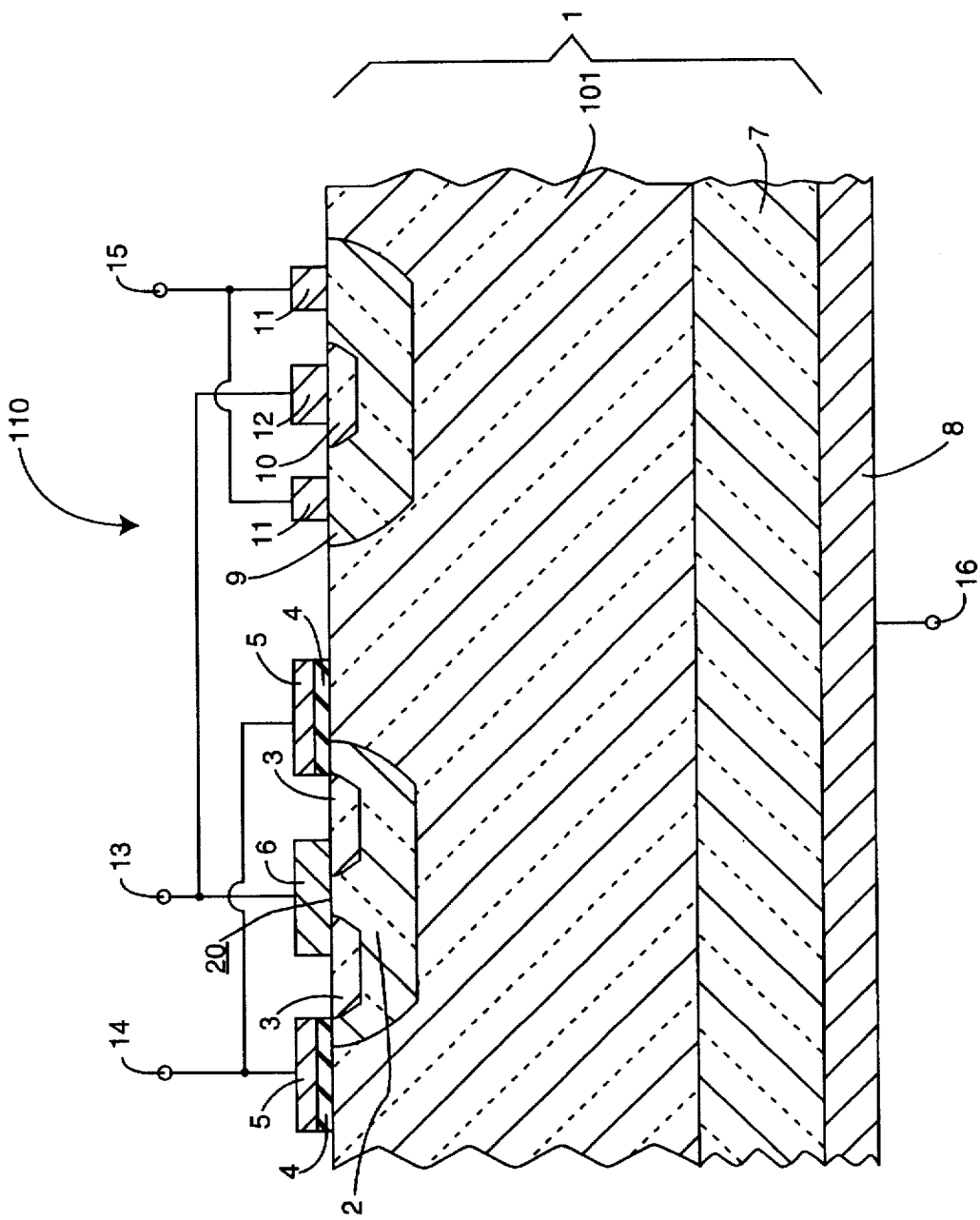
FIG. 1 is a cross section of a semiconductor apparatus according to an embodiment of the present invention.

Referring to FIG. 1, a semiconductor apparatus shown generally at 110, is developed on a substrate 1 which is originally lightly doped n-type. After all the pertinent semiconductor regions are formed, n-type substrate 1 becomes an n⁻ region 101 on a p⁺-type, or n⁺-type layer collector region 7. A collector electrode 8 is disposed on collector region 7. A p-type well region 2 is formed in a first surface portion of n-type substrate 1. An n⁺ emitter region 3 is formed in a surface portion of p-type well region 2. A gate electrode 5 is affixed over a gate insulation film 4 to a portion of p-type well region 2 separating n⁺ emitter region 3 and n⁻ region 101 from each other. An emitter electrode 6 covers contact region 20 of p-type well region 2 and an adjacent portion of n⁺ emitter region 3.

A p-type anode region 9 is formed in a second surface portion of n-type substrate 1. P-type anode region 9 is separated from p-type well region 2 by n⁻ region 101. An n-type cathode region 10 is centered in a surface of p-type anode region 9. An anode electrode 11 is disposed on p-type anode region 9. A cathode electrode 12 is disposed on n-type cathode region 10. P-type anode region 9 and n-type cathode region 10 constitute a pn diode which serves as a temperature sensor (to be described later).

Cathode electrode 12 is connected to emitter electrode 6. Emitter electrode 6 is connected to an emitter terminal 13. Gate electrode 5 is connected to a gate terminal 14. Anode electrode 11 is connected to a temperature sensing terminal 15. Finally, collector electrode 8 is connected to a collector terminal 16.

In the structure described above, when collector region 7 is p⁺ type and the power device is an IGBT, an npnp quadruple-layered structure (a parasitic thyristor) is formed, consisting of n-type cathode region 10, p-type anode region 9, n⁻ region 101 and p⁺ collector region 7. However, since a p-n junction between p-type anode region 9 and n-type cathode region 10 is doped very heavily, electron injection from n-type cathode region 10 is suppressed. For example, even when a current of from several to several tens of mA flows from p-type anode region 9, the current does not cause latching up in the p-n junction between p-type anode region 9 and n-type cathode region 10. On the other hand, when the collector region 7 is an n⁺ type one and the power device is a MOSFET, the parasitic thyristor described above is not formed. Thus, latching up in this type of device is also prevented.

Figure 2A:
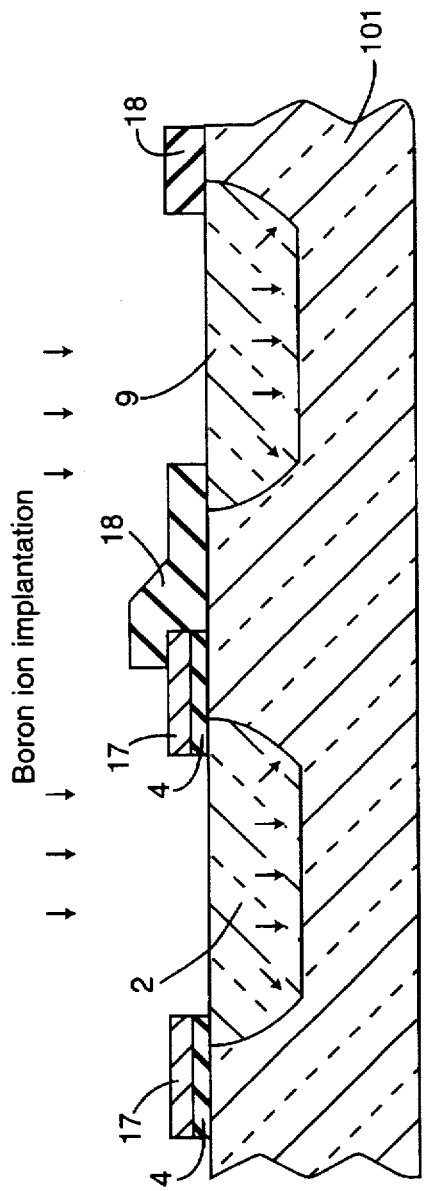
FIG. 2(a) is a cross section showing a manufacturing process of p-type impurity doping.

Referring to FIG. 2(a), boron (B) ions are implanted from a surface of n⁻ region 101. Then, the implanted B ions are thermally diffused to simultaneously form p-type well region 2 and p-type anode region 9. A poly-crystalline silicon film 17 is used as an ion implantation mask for forming p-type well region 2. Poly-crystalline silicon film 17 is later used as gate electrode 5 (as shown in FIG. 1). A photoresist film 18 is used as an ion implantation mask for forming p-type anode region 9.

Figure 2B:
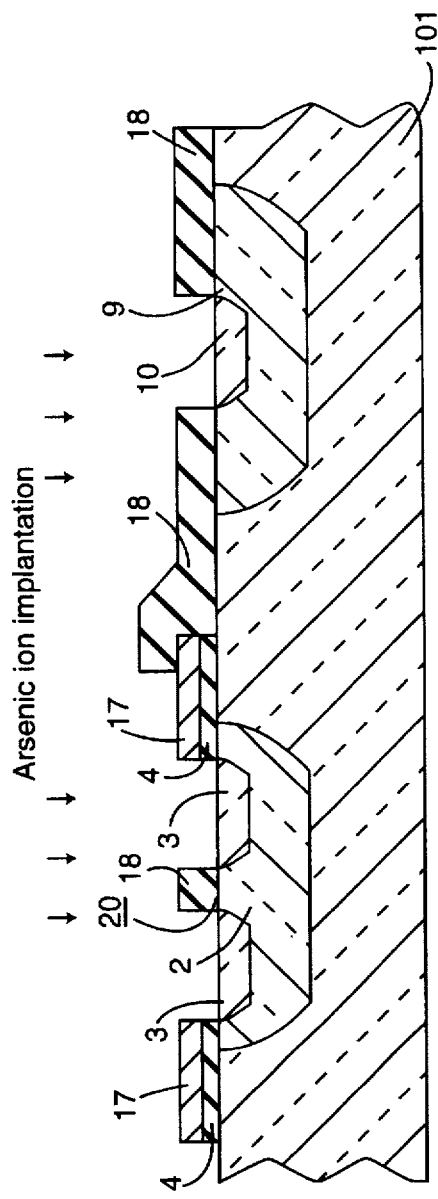
FIG. 2(b) is a cross section showing a manufacturing process of n-type impurity doping.

Referring to FIG. 2(b), arsenic (As) ions are implanted into the surface portions of p-type well region 2 and p-type anode region 9 to simultaneously form n⁺ emitter region 3 and n-type cathode region 10. Poly-crystalline silicon film 17 and photoresist film 18 are used as an ion implantation mask for forming n⁺ emitter region 3. Poly-crystalline silicon film 17 is later used as gate electrode 5 (as shown in FIG. 1). Photoresist film 18 is used as an ion implantation mask for forming n-type cathode region 10. The portion of p-type anode region 9 which contains n-type cathode region 10 constitutes a temperature sensor (to be described later).

Thus, p-type well region 2 and p-type anode region 9 may have a same dopant concentration and a same depth. Also, n⁺ emitter region 3 and n-type cathode region 10 may have a same dopant concentration and a same depth.

Figure 3:
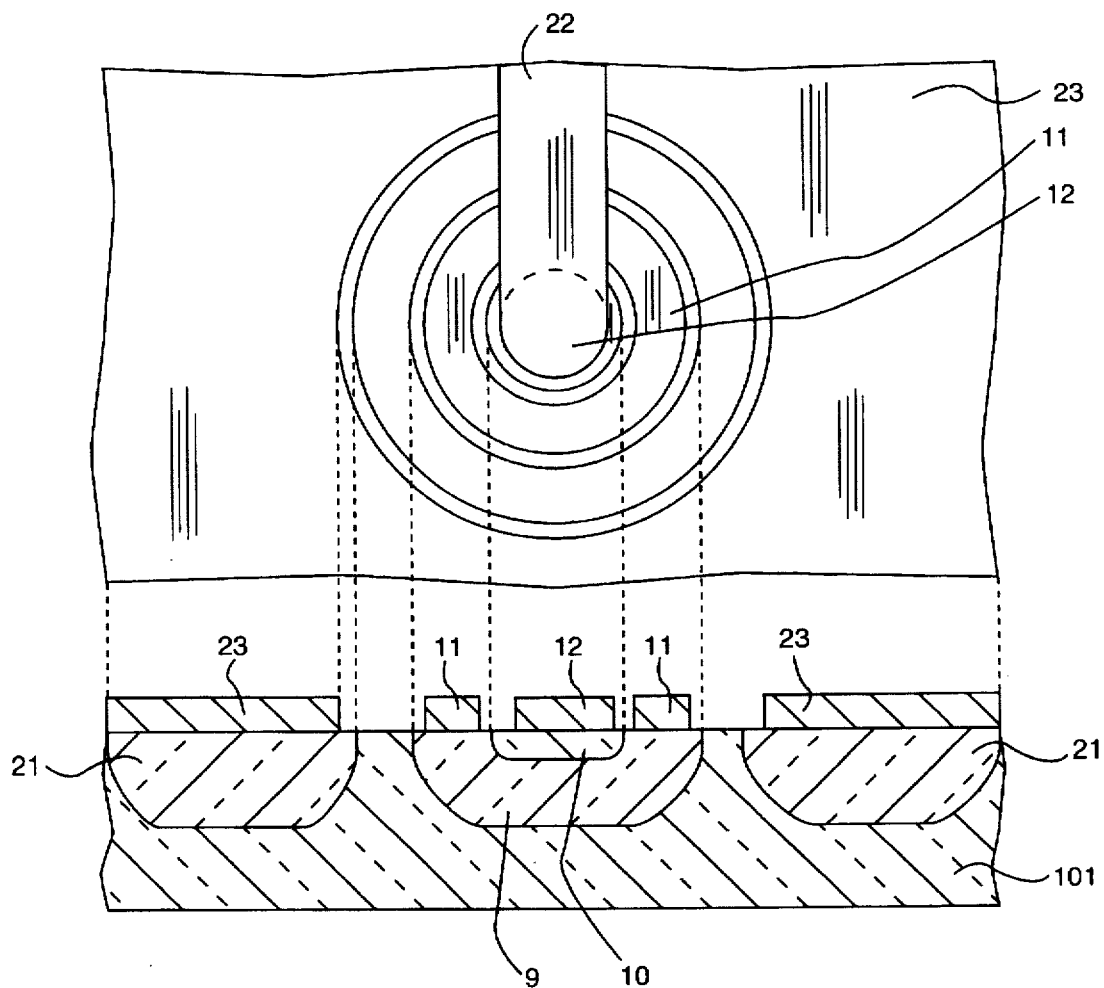
FIG. 3 is a plan view showing a main portion of a second embodiment of a semiconductor apparatus according to the present invention aligned with a cross section taken along A—A.

Referring to the bottom portion of FIG. 3, n-type cathode region 10 and p-type anode region 9 are formed concentrically with each other. A p-type region 21 surrounds p-type anode region 9. Cathode electrode 12 (also shown in FIG. 1) is on n-type cathode region 10. Referring to the top portion of FIG. 3, cathode electrode 12 is connected to an emitter electrode of an IGBT (not shown) via a metal film 22. Anode electrode 11 is on anode region 9. A metal electrode 23 is on p-type region 21. Metal film 22 is insulated from anode electrode 11, metal electrode 23 and n⁻ region 101 by an inter-layer insulation film (not shown). Collector region 7 is located beneath n⁻ region 101 (as shown in FIG. 1) and is thus not seen in FIG. 3.

Figure 4:
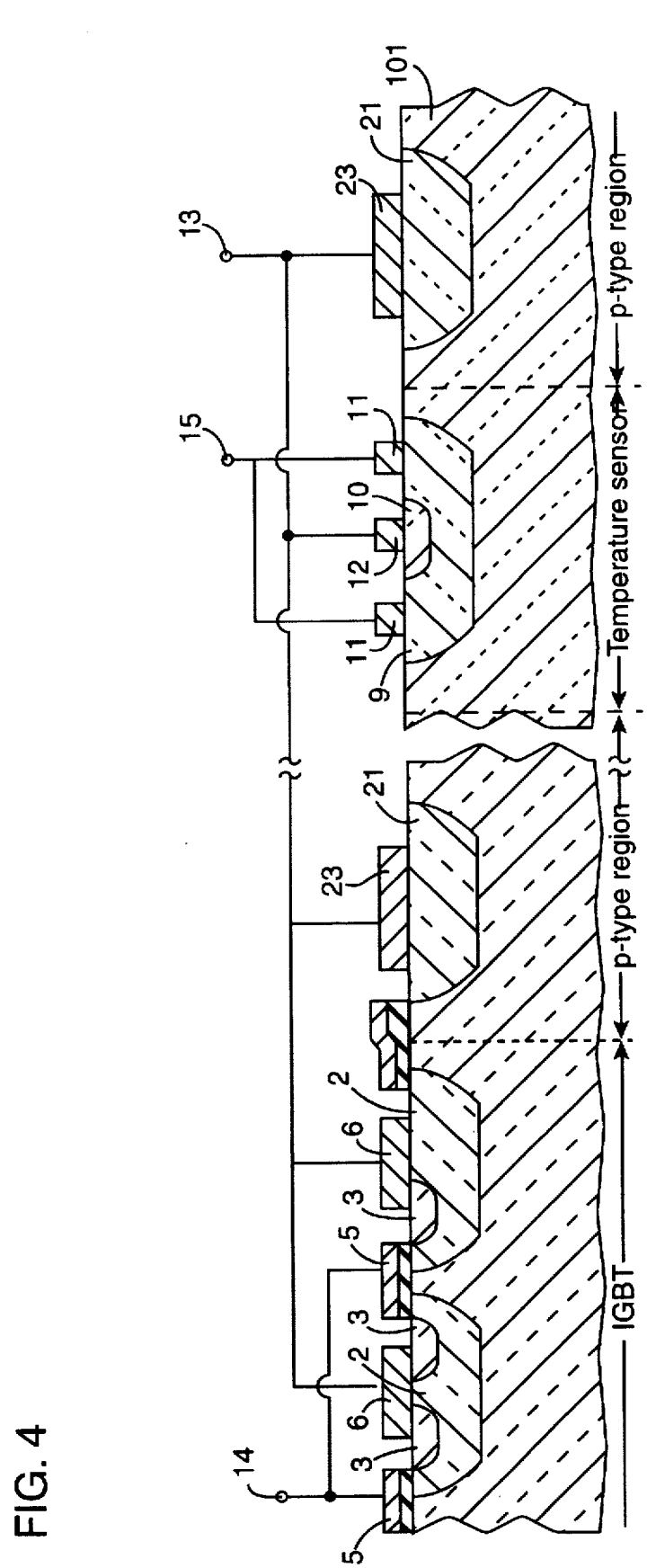
FIG. 4 is a cross section of the second embodiment along the partial cross section shown in FIG. 3.

Referring to FIG. 4, cathode electrode 12, metal electrode 23 and emitter electrode 6 are connected to one another via metal film 22, in the same manner as shown in FIG. 3, and also to emitter terminal 13. Anode electrode 11 is connected to temperature sensing terminal 15. From left to right in the figure, an IGBT portion, a p-type region, a temperature sensor and a p-type region are disposed (all to be described later). The left hand side and right hand side of the semiconductor apparatus are, in fact contiguous, but are separately shown above one another for the sake of illustration convenience.

Figure 5:
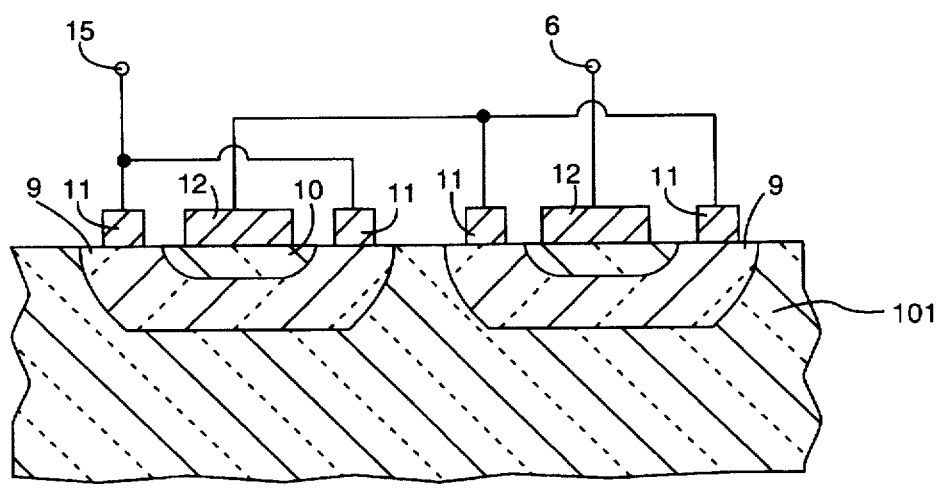
FIG. 5 is a cross section of a third embodiment of a semiconductor apparatus according to the present invention.

Referring to FIG. 5, the third embodiment connects two pn diodes in series to constitute a temperature sensor. Cathode electrode 12 of a first pn diode is connected to anode electrode 11 of a second pn diode. Anode electrode 11 of the first pn diode is connected to temperature sensing terminal 15. Cathode electrode 12 of the second pn diode is connected to emitter electrode 6. Three or more pn diodes may be connected in series. As is well known, a series connection of two pn diodes doubles the forward biased junction voltage drop. In addition, the temperature-dependent change in voltage is also multiplied. This phenomenon is useable to increase the temperature signal amplitude.

Figure 6:
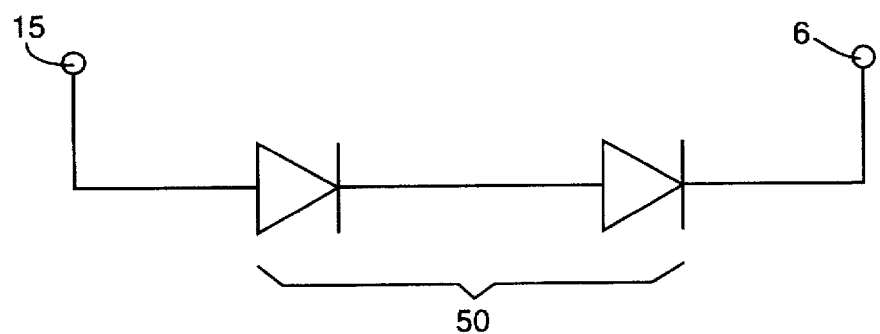
FIG. 6 is an equivalent circuit diagram of FIG. 5.

Referring to FIG. 6, an equivalent circuit of the device of FIG. 5 includes an anode side of a temperature sensor 50 connected to temperature sensing terminal 15. A cathode side of temperature sensor 50 is connected to emitter electrode 6.

Figure 7:
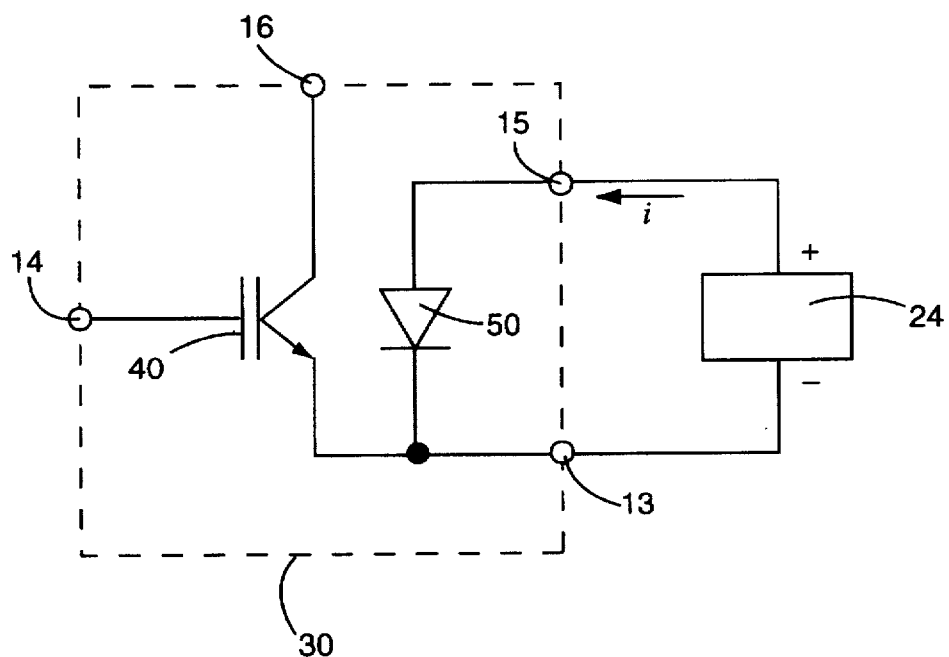
FIG. 7 is an equivalent circuit diagram of a fourth embodiment of a semiconductor apparatus according to the present invention.

Referring to FIG. 7, a semiconductor apparatus 30 includes an IGBT 40 and temperature sensor 50 in thermal communication with each other. Temperature sensor 50 is a pn diode. Temperature sensing terminal 15 is connected to a positive electrode of a constant current supply 24. Emitter terminal 13 of semiconductor apparatus 30 is connected to a negative electrode of constant current supply 24. Internally, emitter terminal 13 is connected to an emitter terminal of IGBT 40 and to a cathode terminal of temperature sensor 50. The resulting small current flows from an anode of the pn diode to its cathode.

Figure 8:
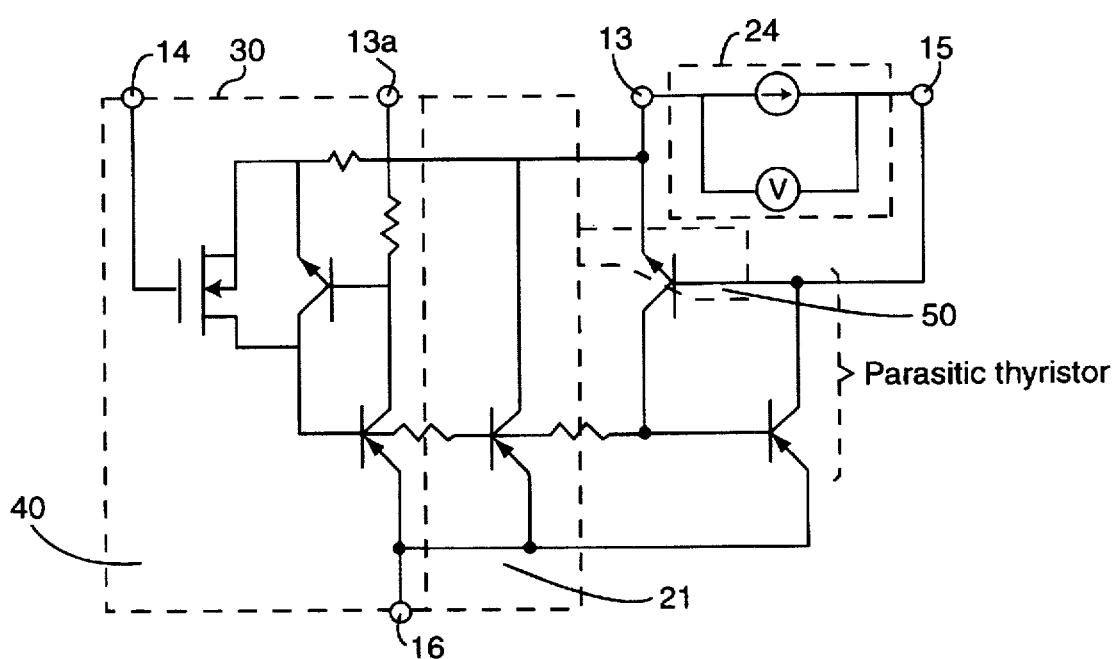
FIG. 8 is an equivalent circuit diagram of the semiconductor apparatus of FIG. 4 including p-type regions.

Referring to FIG. 8, in an equivalent circuit diagram of the embodiment of FIG. 4, constant current supply 24 is connected to semiconductor apparatus 30. IGBT 40, p-type region 21 and temperature sensor 50 are arranged side by side from the left hand side of the figure. Parasitic pnp and npn transistors constitute a pnpn parasitic thyristor in temperature sensor 50. Constant current supply 24 is connected as shown in FIG. 8. Another emitter terminal 13a is connected for making a main current flow through IGBT 40. Emitter terminal 13a is included when it is necessary to make a very high current flow through IGBT 40.

Figure 9A:
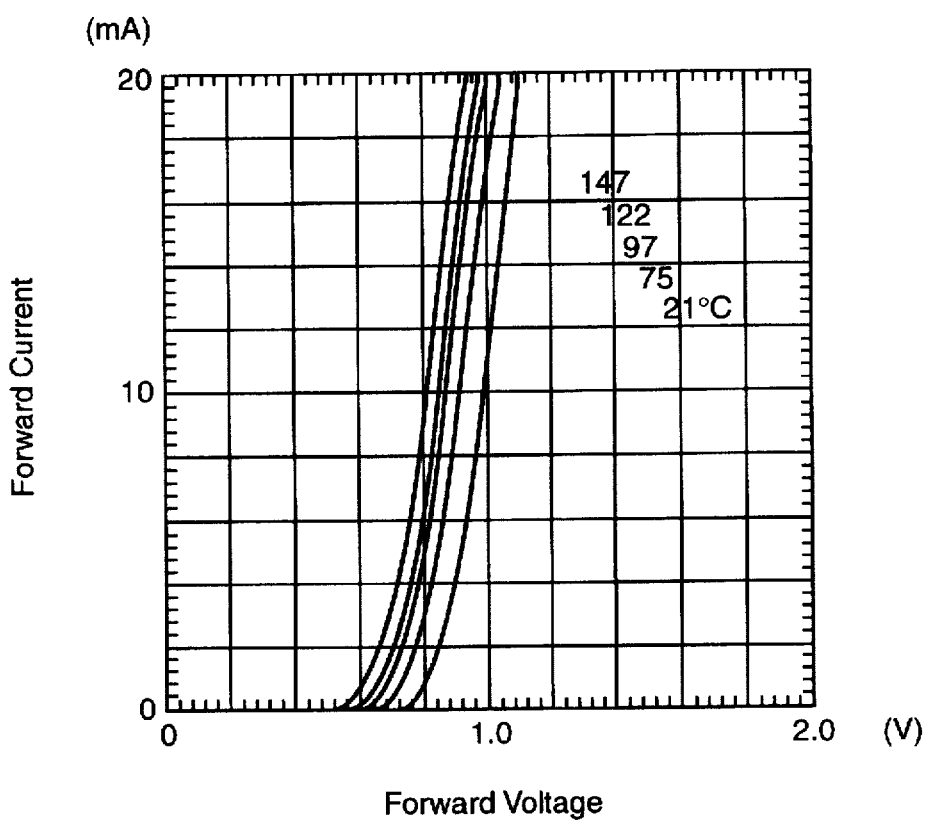
FIG. 9(a) is a set of curves relating a forward voltage of a temperature sensor with a forward current of up to 20 mA with a temperature as a parameter.

Referring to FIG. 9(a), a forward voltage of temperature sensor 50 is related to a forward current of up to 20 mA with a temperature as a parameter. The abscissa is divided every 0.2 V. It will be noted that the voltage at constant current is sensitive to temperature. That is, at higher temperature, the voltage is lower than at lower temperature due to increased charge carrier mobility at higher temperature.

Figure 9B:
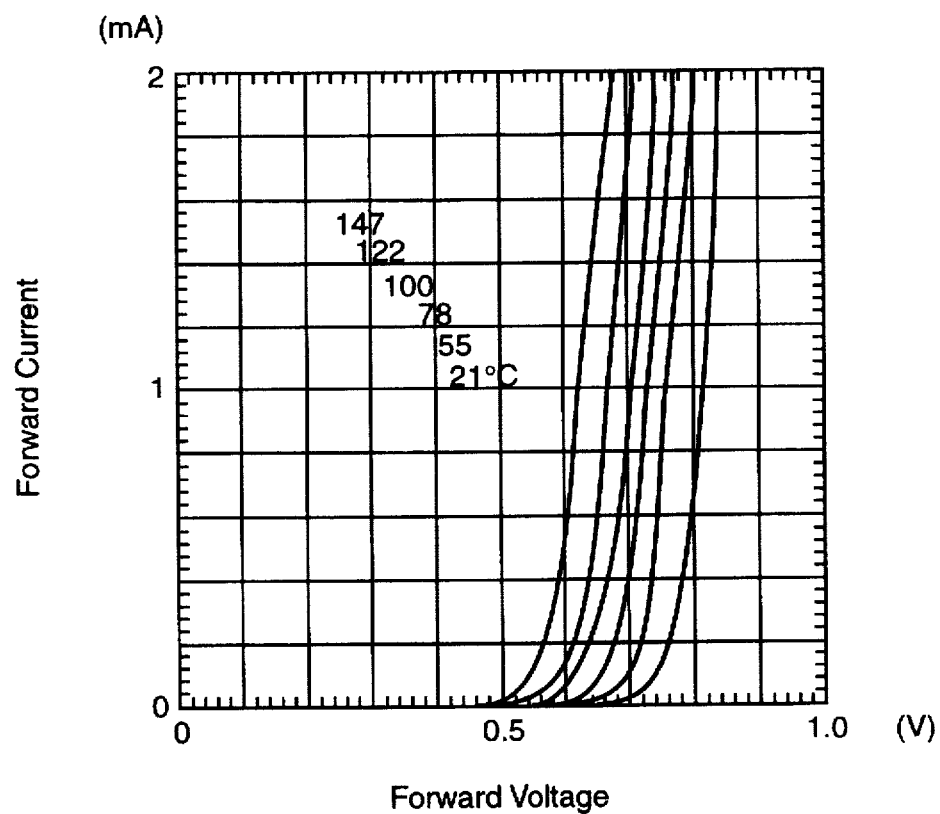
FIG. 9(b) is a set of curves relating the forward voltage of the temperature sensor with the forward current of up to 2 mA with temperature as a parameter.

FIG. 9(b) examines a limited range of voltage and current of FIG. 9(a) to aid in visualizing the effect. The forward voltage of temperature sensor 50 is related to the forward current up to 2 mA with temperature as a parameter. The abscissa is divided every 0.1 V.

Figure 10:
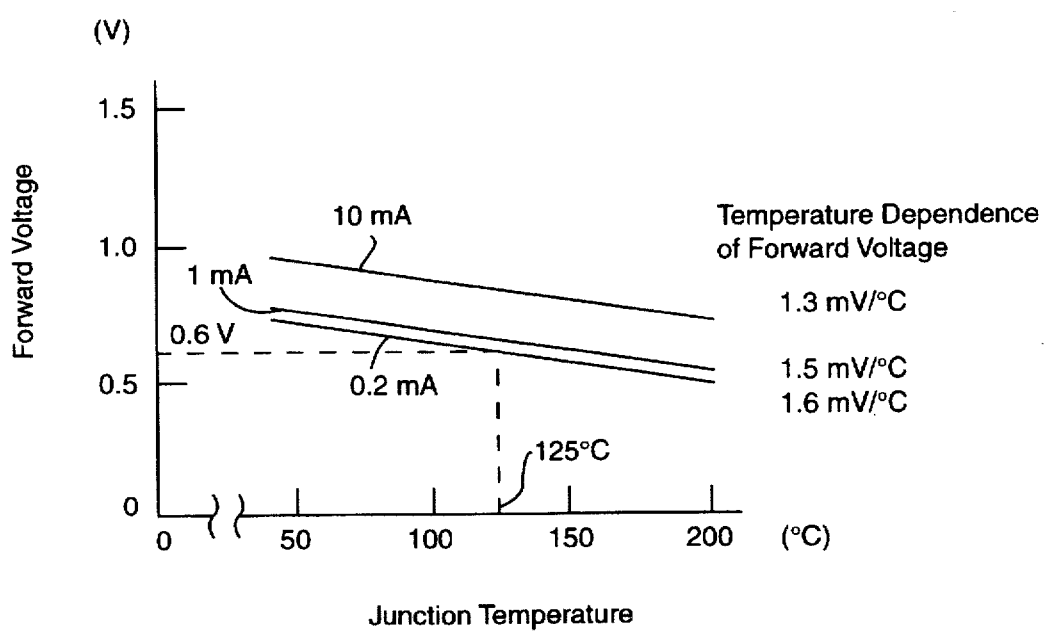
FIG. 10 is a graph showing the relationship between the forward voltage and a junction temperature based on the data of FIGS. 9(a) and 9(b).
Figure 11:
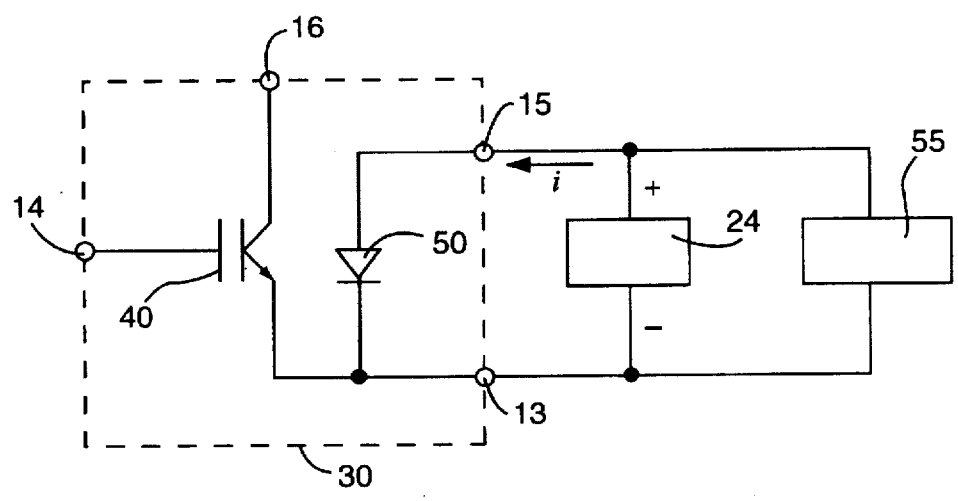
FIG. 11 is the equivalent circuit diagram of FIG. 7 including an external protection circuit.

Referring to FIG. 10, it is preferable to use a current value at which the forward voltage changes greatly with temperatures to detect a temperature from the forward voltage. A current of 0.2 mA (a sensing current value) from constant current supply 24 establishes an operating point in the most sensitive region. For a current of 0.2 mA, the temperature of the temperature sensor 50, i.e. IGBT 40 temperature, is 125° C. when the forward voltage of the temperature sensor 50 (a detected voltage value) is 0.6 V. Therefore, IGBT 40 is prevented from breakdown caused by overheating, by actuating an external protection circuit 55 (as shown in FIG. 11) when the forward voltage reaches a predetermined value, 0.6 V for example, so that the temperature of IGBT 40 is limited to values at or below about 125° C.

IPMs exhibiting the same effects as those of the foregoing embodiments are obtained by using a p-type substrate on which each region of an opposite conductivity type to that of the foregoing embodiments is disposed.

As described above, temperature sensor 50 is integrated with IGBT 40 on one semiconductor substrate in the semiconductor apparatus of the invention. Therefore, IGBT 40 is securely protected against overheating, since the accurate temperature of IGBT 40 is quickly detected. The effects of the invention are multiplied by connecting multiple pn diodes to constitute temperature sensor 50.

Temperature sensor 50 of the present invention is formed during the process of forming the remainder of semiconductor apparatus 30. In comparison with fabrication of a device having a separate semiconductor and thermistor fastened adjacent to each other on a plate, the present invention is much lower in cost, as well as being much more sensitive and temporally responsive to temperature changes.

Having described preferred embodiments of the present invention with reference to the accompanying drawings, it is to be understood that the present invention is not limited to the precise embodiments, and that various changes and modifications may be effected therein by one skilled in the art without departing from the scope or spirit of the present invention which is limited only by the appended claims.

What is claimed is:

1. A semiconductor apparatus, comprising:

a semiconductor substrate of a first conductivity type;

a well region of a second conductivity type in a first surface portion of said semiconductor substrate;

an emitter region of said first conductivity type in said well region;

said well region and said emitter region forming an insulated gate semiconductor device;

an emitter electrode on said emitter region;

an anode region of said second conductivity type in a second surface portion of said semiconductor substrate, said anode region being separated laterally from said well region;

an anode electrode on said anode region;

an anode terminal connected to said anode electrode, said anode terminal and said anode electrode each without electrically conductive connection to said insulated gate semiconductor device;

a cathode region of said first conductivity type in said anode region;

a cathode electrode on said cathode region, said cathode electrode being connected to said emitter electrode; and said anode region and said cathode region forming a pn diode.

2. A semiconductor apparatus according to claim 1, wherein:

said well region and said anode region have a same dopant concentration and a same depth.

3. A semiconductor apparatus according to claim 1, wherein said cathode region is concentrically formed with said anode region.

4. A semiconductor apparatus comprising:

a semiconductor substrate of a first conductivity type;

a well region of a second conductivity type in a first surface portion of said semiconductor substrate;

an emitter region of said first conductivity type in said well region;

said well region and said emitter region forming an insulated gate semiconductor device;

an emitter electrode on said emitter region;

an anode region of said second conductivity type in a second surface portion of said semiconductor substrate, said anode region being separated laterally from said well region;

an anode electrode on said anode region;

a cathode region of said first conductivity type in said anode region;

a cathode electrode on said cathode region, said cathode electrode being connected to said emitter electrode;

said anode region and said cathode region forming a pn diode;

said cathode region is concentrically formed with said anode region;

a region of said second conductivity type surrounding said anode region;

said region of said second conductivity type being spaced laterally from said insulated gate semiconductor device;

a metal electrode on said region of said second conductivity type; and said metal electrode being connected to said cathode electrode and said emitter electrode.

5. A semiconductor apparatus comprising:

a semiconductor substrate of a first conductivity type;

a well region of a second conductivity type in a first surface portion of said semiconductor substrate;

an emitter region of said first conductivity type in said well region;

said well region and said emitter region forming an insulated gate semiconductor device;

an emitter electrode on said emitter region;

an anode region of said second conductivity type in a second surface portion of said semiconductor substrate, said anode region being separated laterally from said well region;

an anode electrode on said anode region;

a cathode region of said first conductivity type in said anode region;

a cathode electrode on said cathode region, said cathode electrode being connected to said emitter electrode;

said anode region and said cathode region forming a pn diode;

an anode terminal connected to said anode electrode;

an emitter terminal connected to said emitter electrode;

a constant current supply;

said constant current supply including a positive electrode connected to said anode terminal and a negative electrode connected to said emitter terminal, whereby a current flows from said anode region to said cathode region;

a temperature sensing terminal for sensing a temperature of said insulated gate semiconductor device from a potential of said anode electrode; and said temperature sensing terminal being connected to said anode electrode.

6. A semiconductor apparatus, comprising:

a semiconductor substrate of a first conductivity type;

a well region of a second conductivity type in a first surface portion of said semiconductor substrate;

an emitter region of said first conductivity type in said well region;

said well region and said emitter region forming an insulated gate semiconductor device;

an emitter electrode on said emitter region;

anode regions of said second conductivity type;

an anode electrode on each of said anode regions;

cathode regions of said first conductivity type formed in said anode regions;

a cathode electrode on each of said cathode regions;

said anode regions and said cathode regions forming at least two pn diodes in a second surface portion of said semiconductor substrate;

said at least two pn diodes being separated laterally from said insulated gate semiconductor device; and metal films formed on said semiconductor substrate with an insulation film interposed in-between, each of said metal films connecting said anode electrode of one of said at least two pn diodes to said cathode electrode of an adjacent one of said at least two pn diodes, whereby said at least two pn diodes are connected in a series connection.

7. A semiconductor apparatus according to claim 6, wherein:

said well region and said anode regions have a same dopant concentration and a same depth; and said emitter region and said cathode regions have a same dopant concentration and a same depth.

8. A semiconductor apparatus according to claim 6, wherein each of said cathode regions is concentrically formed with each of said anode regions.

9. A semiconductor apparatus according to claim 8, further comprising:

a region of said second conductivity type surrounding said anode regions;

said region of said second conductivity type being spaced laterally from said insulated gate semiconductor device;

a metal electrode on said region of said second conductivity type; and said metal electrode being connected to said emitter electrode and said cathode electrode located at an end of said series connection of said at least two pn diodes.

10. A semiconductor apparatus according to claim 6, further comprising:

an anode terminal connected to said anode electrode located at an end of said series connection of said at least two pn diodes;

an emitter terminal connected to said emitter electrode;

a constant current supply;

said constant current supply including a positive electrode connected to said anode terminal and a negative electrode connected to said emitter terminal, whereby a current flows from said anode regions to said cathode regions of said at least two pn diodes;

a temperature sensing terminal for sensing a temperature of said lateral insulated gate semiconductor device from a voltage drop across said at least two pn diodes; and said temperature sensing terminal being connected to said anode electrode located at said end of said series connection.

11. A semiconductor apparatus, comprising:

insulated gate semiconductor device on a semiconductor substrate;

at least one pn diode on said semiconductor substrate in thermal communication with said insulated gate semiconductor device;

a constant current supply; and means for feeding a current of said constant current supply to said at least one pn diode, whereby a voltage across said at least one pn diode is sensitive to a temperature of said insulated gate semiconductor device and monitoring said voltage provides an indication of a temperature of said insulated gate semiconductor device.

12. A semiconductor apparatus according to claim 11, further comprising:

an external protection circuit electrically connected to said at least one pn diode;

said external protection circuit being adapted to prevent said insulated gate semiconductor device from overheating; and said external protection circuit being activated when said voltage across said at least one pn diode reaches a threshold value.

13. A semiconductor apparatus according to claim 11, wherein said at least one pn diode is a pn junction of a transistor.

14. A semiconductor apparatus according to claim 13, wherein said pn junction is doped heavily enough to prevent latching up in said pn junction.

15. A semiconductor apparatus according to claim 11, wherein:

said at least one pn diode includes at least first and second pn diodes; and said at least first and second pn diodes being connected in series.

16. A semiconductor apparatus according to claim 1, wherein:

said emitter region and said cathode region have a same dopant concentration and a same depth.

17. A semiconductor apparatus, comprising:

a MOSFET device on a semiconductor substrate;

at least one pn diode on said semiconductor substrate in thermal communication with said MOSFET device;

a constant current supply; and means for feeding a current of said constant current supply to said at least one pn diode, whereby a voltage across said at least one pn diode is sensitive to a temperature of said MOSFET device and monitoring said voltage provides an indication of a temperature of said MOSFET device.

* * * * *